United States Patent [19]

Grinberg et al.

[11] Patent Number: 4,839,702
[45] Date of Patent: Jun. 13, 1989

[54] SEMICONDUCTOR DEVICE BASED ON CHARGE EMISSION FROM A QUANTUM WELL

[75] Inventors: Anatoly Grinberg, Minneapolis, Minn.; Alexander Kastalsky, Ocean Township, Monmouth County, N.J.

[73] Assignee: Bell Communications Research, Inc., Livingston, N.J.

[21] Appl. No.: 123,143

[22] Filed: Nov. 20, 1987

[51] Int. Cl.$^4$ .................. H01L 29/161; H01L 29/205; H01L 29/225

[52] U.S. Cl. ........................................ 357/16; 357/15; 357/22; 357/23.1; 357/34

[58] Field of Search ............ 357/34 HB, 16, 15, 22 A, 357/4, 34, 23.1

[56] References Cited

U.S. PATENT DOCUMENTS

4,532,533 7/1985 Jackson et al. .................. 357/16
4,684,969 8/1987 Taguchi .......................... 357/16 X

FOREIGN PATENT DOCUMENTS

0092645 2/1983 European Pat. Off. ............. 357/34
2159664 12/1985 United Kingdom ................. 357/16

OTHER PUBLICATIONS

"Ohmic, Superconducting, Shallow AuGe/Nb Contacts to GaAs", *J. Appl. Phys.*, M. Gurvitch, A. Kastalsky, S. Schwarz, D. M. Hwang, D. Butherus, S. Pearton and C. R. Gardner, vol. 60(9), Nov. 1, 1986, pp. 3204–3210.

"In $_{0.53}$Ga$_{0.47}$As FET's with Insulator-Assisted Schottky Gates", *IEEE Electron Device Letters*, P. O'Connor, T. P. Pearsall, K. Y. Cheng, A. Y. Cho, J. C. M. Hwang, and K. Alavi, vol. EDL-3, No. 3, Mar. 1982, pp. 64–66.

"700 mS/mm 2DEGFETs Fabricated from High Mobility MBE-Grown n-AlInAs/GaInAs Heterostructures", *Intern. Sympos. GaAs and Related Compounds*, Karuizawa, Japan, 1985, K. Hirose, K. Ohata, T. Mizutani, T. Itoh and M. Ogawa, pp. 529–534.

"High-Frequency Amplification and Generation in Charge Injection Devices", *Appl. Phys. Lett.*, vol. 48(1), Jan. 6, 1986, A. Kastalsky, J. H. Abeles, R. Bhat, W. K. Chan and M. A. Koza, pp. 71–73.

"Tunneling Hot-Electron Transfer Amplifier: A Hot-Electron GaAs Device with Current Gain", *Appl. Phys. Lett.*, vol. 47 (10), Nov. 15, 1985, M. Heiblum, D. C. Thomas, C. M. Knoedler and M. I. Nathan, pp. 1105–1107.

"An Induced Base Hot-Electron Transistor", *IEEE Electron Device Letters*, vol. EDL-6, No. 4, Apr. 1985, S. Luryi, pp. 178–180.

Primary Examiner—Andrew J. James
Assistant Examiner—Sara W. Crane
Attorney, Agent, or Firm—James W. Falk

[57] ABSTRACT

A semiconductor device implemented on a substrate which includes a first layer of semiconductor material of a first conductivity type composed of a semiconductor material and forming a first active region of said device, and a second layer of semiconductor material of a first conductivity type composed of a relatively wide energy bandgap material disposed on the first layer and forming a second active region of the device. A third layer of semiconductor material is provided composed of a relatively narrow energy bandgap material disposed on the second layer and having an energy band step such that carriers are confined in that layer. A fourth layer of semiconductor material of a first conductivity type is further provided composed of a relatively wide energy bandgap material disposed on the third layer and forming a third active region of the device. The resulting structure provides a new type of transistor action that combines the properties of both bipolar and field effect transistors in a three terminal electronic device.

21 Claims, 5 Drawing Sheets

SEMICONDUCTOR DEVICE BASED ON CHARGE EMISSION FROM A QUANTUM WELL

BACKGROUND OF THE INVENTION

1. Field of the Invention

The invention relates to semiconductor devices and semiconductor device fabrication, and in particular a method of forming a quantum well semiconductor device demonstrating transistor action based upon the quantum properties of electrons in a narrow quantum well, and devices made thereby.

2. Description of the Prior Art

There are a variety of different types of semiconductor devices known in the prior art. One of the more general methods of classifying these devices is in respect to the physical basis for device operation, in which there are three categories:

1. charge variation in the gate capacitor (field-effect transistors or FETs);
2. variation of a potential barrier for charge injection (e.g., bipolar, permeable base, hot electron transistors); and
3. variation of electron temperature (CHINT), as described in A. Kastalsky, J. M. Abeles, R. Bhat, W. K. Chan and M. A. Koza, Appl. Phys. Lett. 48, 71, (1986)

In gallium arsenide technology, a number of these different types of semiconductor devices, and semiconductor device structures have been investigated and are known in the art. GaAs MESFET devices, for example, have been quite successful in applications such as microwave and high speed digital circuits. This success of GaAs MESFET's has been due mainly to high electron velocity of GaAs and the commercial availability of semi-insulating GaAs substrates for device fabrication. Some of the drawbacks of GaAs MESFET technology are difficult circuit modeling and design, poor threshold voltage control, and the sensitivity of MESFET circuit operation to load conditions.

Bipolar technology is well known for its advantages in terms of uniform threshold, noise immunity, high speed and high current drive. A conventional bipolar transistor has an npn or pnp structure wherein emitter, base, and collector layers are made of a common semiconductor material. In this case, emitter and collector junctions are homojunctions.

Bipolar transistors using a heterojunction as the emitter-base junction are receiving a great deal of attention and are being extensively studied these days. The heterojunction bipolar transistor with the emitter energy gap wider than that of the base has an advantage in that, when the emitter junction is forward biased, carriers can be easily injected from the emitter to the base while carrier injection from the base to the emitter is limited due to an energy gap difference between emitter and base layers. Therefore, a current gain of the heterostructure bipolar transistor becomes higher than that of the conventional homostructure type.

In all of the semiconductor device structures of the prior art, none is based on quantum properties of the materials or structures. In other words, the basic transistor action in prior art devices is based upon and can be satisfactorily described without reference to any quantum effect. Although quantum effects may influence device performance in the prior art (for example, mobility enhancement in the 2-dimensional channel of the modulation doped FET or MODFET) or bring about useful device modification such as a tunnel emitter in the hot electron transistor, (M. Heiblum, D. C. Thomas, C. M. Knoedler and M. I. Nathan, Appl. Phys. Lett. 47, 1105, 1985) or in the quantum well base in the induced-based transistor (S. Luryi, IEEE Electr. Dev. Lett. EDL-6, 178, 1985), prior to the present invention a device has not been constructed in which the transistor action itself is based on the quantum properties of the device structure.

SUMMARY OF THE INVENTION

Briefly, and in general terms, the present invention provides a semiconductor device implemented on a substrate including a first layer of semiconductor material of a first conductivity type forming a first active region of the device. A second layer of semiconductor material of a first conductivity type composed of a relatively wide energy bandgap material is disposed on the first layer and forms a second active region of the device. A third layer of semiconductor material composed of a relatively narrow energy bandgap material, is disposed on the second layer. The third layer has an energy band step such that carriers are confined in that layer, which defines a quantum well. A fourth layer of semiconductor material of a first conductivity type composed of a relatively wide energy bandgap material is disposed on the third layer and forms a third active region of the device. The device has contacts to the first and third layers and a Schottky barrier (gate) contact to the fourth layer. When appropriate electrical potential is provided to the active regions, the resulting structure provides a new type of transistor action that combines the properties of both bipolar and field effect transistors in a three terminal electronic device.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWING

FIG. 1b shows the energy-band diagram for the section of the device shown by the sectional line in FIG. 1a;

DESCRIPTION OF THE PREFERRED EMBODIMENT

Figure 1B:
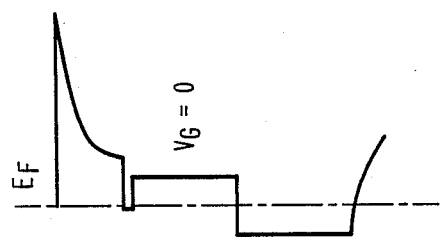
Figure 1A:
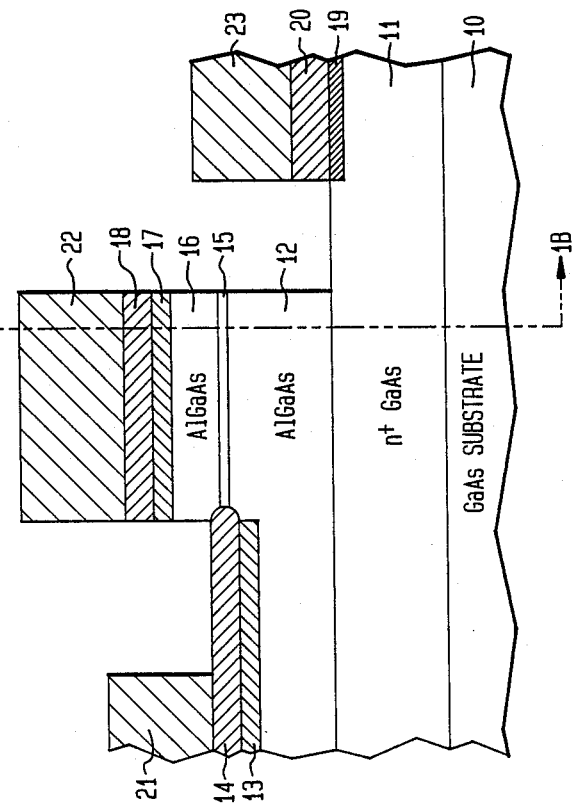
FIG. 1a is a simplified vertical sectional view, partially diagrammatic, of a portion of a quantum well emission transistor (QWET), in accordance with a first embodiment of the present invention.

FIG. 1a shows the device structure, and FIG. 1b shows the energy band diagram of the semiconductor device according to the present invention. The starting point of fabricating the semiconductor device according to the present invention is to provide a crystal wafer of gallium arsenide (GaAs) oriented in the <100> direction which forms the substrate 10. The basic method of making the semiconductor devices according to the present invention is to grow or deposit the required sequence of semiconductor crystal layers with specific doping and chemical composition on the semiconductor substrate or wafer. A plurality of distinct electronic devices may then be implemented on a major surface of the semiconductor wafer utilizing portions of such layers as active semiconductor regions. The devices may vary in structure, size, shape, composition, and function, and the use of particular layers, structures, and devices in the description hereunder are merely illustrative.

The geometry and interconnections of such devices can be defined by masking and etching according to techniques known in the art. The mesas or different levels of the layers are formed by ion milling through a photoresist mask. The deposition of the contacts is performed by evaporation through photoresist masks. Silicon nitride is used to provide isolation between interconnections. Once such structures are defined on the wafer, the cleaving of the wafer into dice representing individual semiconductor circuits and the provision of electrical contacts to each die are well known to those skilled in the integrated circuit art.

The present description therefore focuses on the growth and deposition of the multiple layer structure on the substrate and the resulting electrical characteristics of the semiconductor device according to the present invention. There are a number of acceptable methods of crystal growth which are well known to those skilled in the semiconductor art. These include molecular beam epitaxy (MBE), and metalloorganic chemical vapor deposition (MOCVD). Either of these methods of producing the desired crystal layer structure may be selected as is appropriate for the particular device structures.

More particularly, turning to FIG. 1a, the first embodiment of the present invention provides a semiconductor device implemented on a GaAs substrate 10 including a first layer 11 of semiconductor material of a first conductivity type (n+) and forming a first active region of the device which we may designate as the "collector". A second layer 12 of semiconductor material of a first conductivity type composed of a relatively wide energy bandgap material (such as AlGaAs) is disposed on the first layer 11 and forms a second active region of the device which we may designate as the "source". A third layer 15 of semiconductor material is provided disposed on the second layer 12 and composed of a relatively narrow energy bandgap material (such as GaAs). The third layer 15 is disposed on the second layer 12 and has an energy band step such that carriers are confined in that layer. Such a layer is known as a quantum well.

A fourth layer 16 of semiconductor material of a first conductivity type is further provided composed of a relatively wide bandgap material (such as AlGaAs) disposed on the third layer 15 and forming a third active region of the device which we may designate as the "gate".

The device is provided with contacts 23 and 21 to the first and third layers respectively and Schottky barrier (gate) contact 22 to the fourth layer 16. When appropriate electrical potential is provided to the contacts and thus to the active regions, the resulting structure provides a new type of transistor action that combines the properties of both bipolar and field effect transistors in a three terminal electronic device. A more detailed analysis of different materials, structures and contact geometry will be described subsequently.

Here, we more specifically describe the device structure and the principles of device operation in the first embodiment using the modulation doped $Al_xGa_{1-x}As/GaAs$ heterostructure, where x is a positive number less than 1 and signifies the proportion of aluminum in the material. The results of calculation for $In_{0.47}Ga_{0.53}As$-based heterojunctions in the second embodiment will also be presented. A key element of the structure is a thin (<100 Å) GaAs quantum well layer 15 sandwiched between $Al_xGa_{1-x}As$ layers 12 and 16 of different Al content (x). In a preferred embodiment, the top $Al_{0.5}Ga_{0.5}As$ layer 16 is n+doped. The bottom insulating $Al_xGa_{1-x}As$ layer 12 ($x \lesssim 0.4$), separates the quantum well from the n+GaAs layer 11, which serves as a collector region.

The contacts to the active regions are fabricated by deposition of titanium (Ti) to form layers 13, 17, and 19; followed by a deposition of a germanium gold (Ge:Au) alloy to form layers 14, 18, and 20; and finally a top contact metal (such as gold) to form layers 21, 22, and 23. The layer 14 also makes contact with the third layer 15 of semiconductor material, in addition to the second layer 12 of semiconductor material. The top gate (G) contact 22 is made as a Schottky barrier; the source (S) 21 and the collector (C) 23 contacts are low resistive ohmic contacts to the quantum well region 15 and the collector region 11, respectively.

FIG. 1b shows the band diagram of the device. We assume that when no gate voltage ($V_G$) is applied the quantum well has an undisturbed rectangular shape with the left wall (adjacent to the $n^+Al_{0.5}Ga_{0.5}As$ layer) higher than the right one. A quantum well is formed from a thin layer for a first semiconductor material disposed between two layers of a second semiconductor material having an energy gap larger than the first material. As in an ordinary energy well, carriers will be confined to the quantum well layer. Positive $V_G$ applied relative to the source (grounded) pulls down the left wall of the quantum well and creates a quasi triangular form of potential in the quantum well. As a result of such a distortion, the energy $E_1$ of the ground state (counted from the energy $E_c$) will be lowered by $-\Delta E_1 = E_1 - E_1'$. At the same time the gate voltage increases the electron concentration n in the qunatum well and raises the Fermi level relative to the ground state $E_1$ by the amount $\Delta E_F$. Both $\Delta E_1$ and $\Delta E_F$ contribute (with different sign) to the variation of the work function for thermionic emission from the quantum well to the collector giving an increment $\Delta \phi = -\Delta E_F + \Delta E_1$.

Therefore, in the case when $\Delta E_F - \Delta E_1 > 0$ the linear increase of the gate voltage will result in an exponential enhancement of the collector current density $J_C \sim \exp$ ($-\phi/kT$). Such a variation of the output (collector) current introduces a new principle for transistor action, namely, gate controlled thermionic emission from the quantum well. Since the process of thermionic emission offers current densities as large as $\sim 10^6 A/cm^2$ (at $\phi \rightarrow 0$) the device (which we call a Quantum Well Emission Transistor-QWET) is expected to possess a very large current drive and a high transconductance $g_m$. To minimize current leakage to the gate (due to the same process of thermionic emission), the gate side barrier in the quantum well must be larger than the collector side barrier.

For efficient operation of the QWET one needs a fast rise of the Fermi level ($\Delta E_F$) and a slow decrease of the ground state energy $\Delta E_1$ with $V_G$. This imposes certain requirements both on the material properties and on the width L of the quantum well. First, it is obvious that material with lower electron effective mass $m^*$ provides a steeper rise of the Fermi level with increasing concentration ($\Delta E_F \sim (1/m^*)$). Secondly, to minimize the lowering of the ground state $\Delta E_1$ one has to reduce the width of the quantum well (in the limit of an infinitely narrow quantum well, the effect of ground state lowering will vanish, $\Delta E_1 \rightarrow 0$). Additionally, since $\Delta E_F \times (C \Delta V_G / D)$ (where $D = (m^*/\pi h^2)$ is a two-dimensional density of states in the quantum well, $C = (\epsilon/d_1)$ is the capacitance per unit area, $d_1$ is the thickness of the $n^+$AlGaAs layer), we obtain $\Delta E_F = (\pi h^2 \epsilon \Delta V_G / m^* d_1)$, and therefore for the given width L the use of material with lower $m^*$ and higher dielectric constant $\epsilon$ will be beneficial for device performance. This means that InGaAs-based devices are expected to be more efficient than their GaAs/AlGaAs counterparts because of the lower $m^*$ and higher $\epsilon$ in the former material. A natural limitation on the minimal width L of the quantum well comes from the magnitude of conduction band offset since the ground state energy in the undisturbed quantum well $(V_G=0)E_1 = (\pi^2 h^2 / 2m^* L^2)$ should be lower than the barrier energy $\phi_2$ at least by several kT.

Below we discuss the most important characteristics of the QWET employing a modulation doping approach. Data for both GaAs-based ($M^*=0.07$; $\epsilon=13$) and $In_{0.47}Ga_{0.53}As$-based ($m^*=0.041$; $\epsilon=13.7$) devices obtained using variational approach in the calculation of the energy $E_1(V_G)$ are presented in FIGS. 2 and 3.

Figure 2:
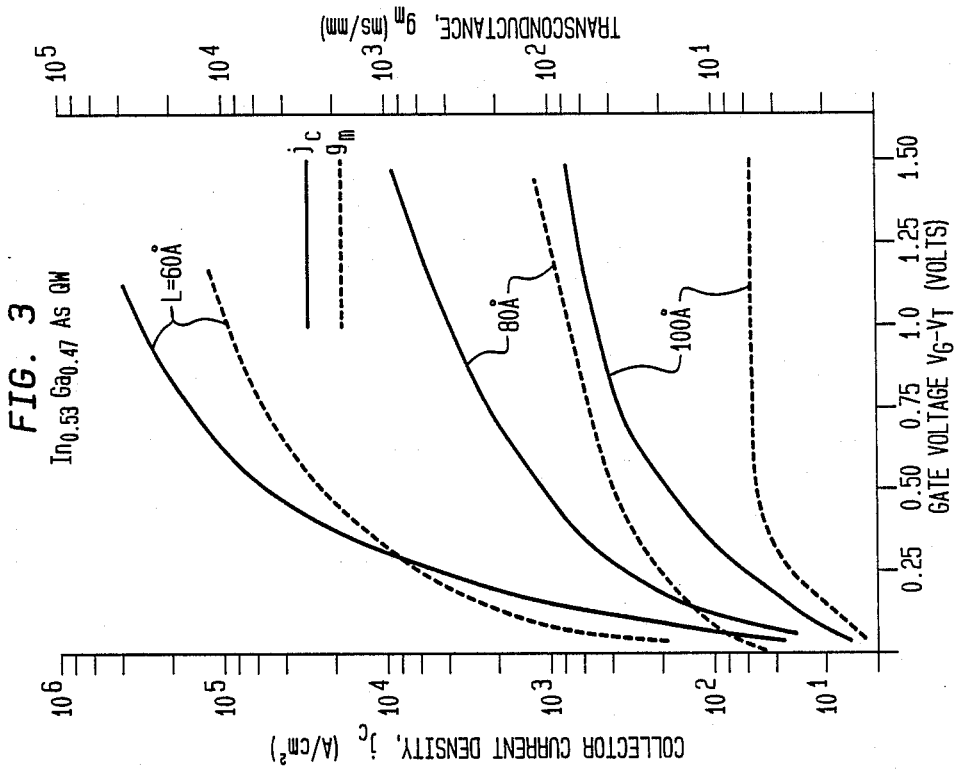
FIG. 2 is a graph of the collector current density and transconductance versus gate voltage for a GaAs/AlGaAs-based device according to the present invention at different gate lengths.
Figure 3:
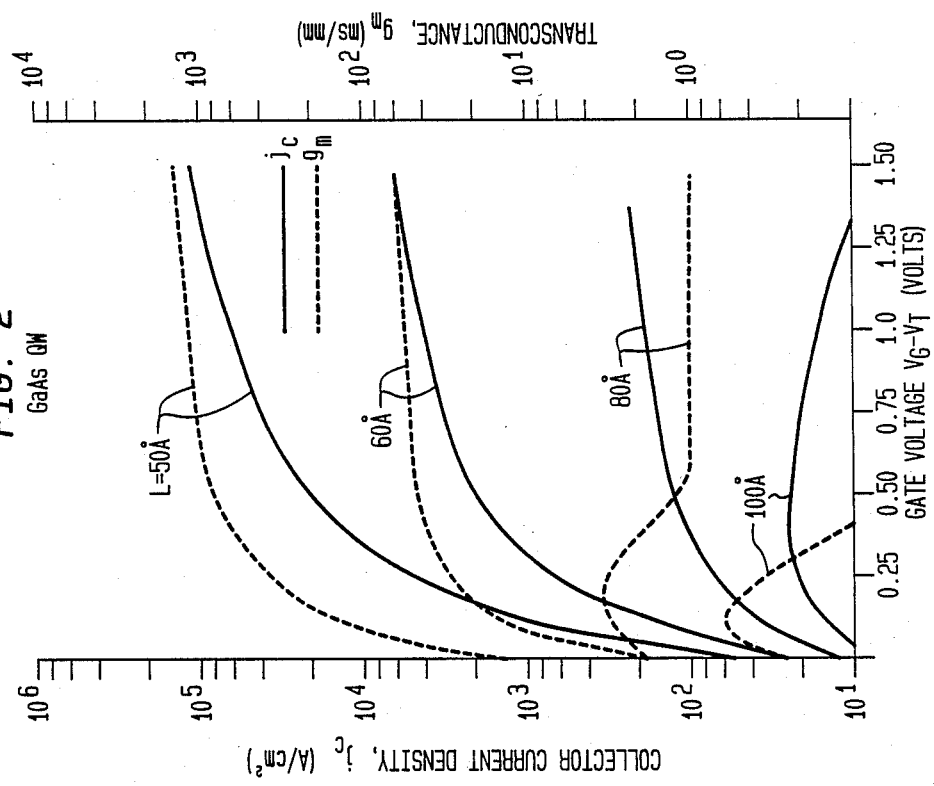
FIG. 3 is a graph of the collector current density and transconductance versus gate voltage for an InGaAs-/InAlAs band device according to the present invention at different gate lengths.

FIG. 2 illustrates the room temperature $j_C - V_G$ characteristics (solid lines) for GaAs-based devices employing the materials discussed and for a set of quantum well widths. Dashed lines are the corresponding dependences of transconductances $g_m$. For all cases presented the collector voltage is kept small but sufficient to neutralize a potential rise caused by the electron charge dynamically stored on the downhill slope of the collector barrier. An extreme sensitivity of the outer current density $j_C$ and the transconductance $g_m$ to the width L is evident. As expected, $j_C$ and $g_m$ are small for the GaAs QW (FIG. 2) with the width L=80 Å. For L=100 Å we observe a clear drop of both $j_C$ and $g_m$. Much higher current densities and transconductances are obtained for L=60 Å. Finally, for L=50 Å and $V_G - V_t \approx 1V$ $j_C$ approaches $\sim 10^5 A/cm^2$ with $g_m > 1 S/mm$.

Characteristics for the InGaAs QWET, (shown in FIG. 3) reveal even much higher performance. For example, when L=60 Å the maximum current density (at $V_G - V_t = 1.1 V$) reaches $\approx 4 \times 10^5 A/cm^2$ with $g_m \times 10$ S/mm (further continuation of the dependences $j_C(V_G)$ and $g_m(V_G)$ for this particular case is unphysical since at $V_G - V_{th} = 1.1 V \phi_2 = 0$). The comparison of an InGaAs QWET with similar characteristics (L=60 Å, $V_G - V_t \sim 1.1 V$) to the GaAs QW shows that the current density is $\sim 300$ and the transductance is $\sim 200$ times greater for the InGaAs QWET. Thus, we come to the conclusion that the device performance crucially depends on both choice of material for the quantum well and its width. The materials with lowest carrier effective mass are preferable. The narrower the width L of the quantum well, the better the device properties that are to be expected. The limitation on L is imposed by a band discontinuity at the heterojunction forming the quantum well. The restrictions on the gate voltage swing are caused by the gate leakage due to electron transfer from the quantum well into the top $n^+$AlGaAs layer occurring at high $V_G$. Both these features resulting from the modulation doping approach used in our calculation limit the maximum gate bias to $V_G - V_t \approx 1V$. Later we will describe the other device structures where these difficulties can be avoided. Now we are going to discuss the intrinsic speed of the QWET and its possible RC limitations.

As in the case of an FET, the intrinsic delay time $\tau$ of the QWET can be defined as $\tau = C/g_m$ where C is the gate capacitance. Using the gate insulator thickness $\sim 300$ Å and the highest values of $g_m$ (shown in FIG. 2) we have $\tau \approx 1.2$ psec and $\tau \approx 0.15$ psec for GaAs- and InGaAs-based devices, respectively. The obtained values of $\tau$ are significantly lower than these for the equivalent parameter $\tau_{FET}$ in GaAs/AlGaAs MODFET (known as a fastest FET to date) of the same gate length $L_g$: $\tau_{FET} = L_g / V_{sat}$. Even for saturated velocity $V_{sat}$ as high as $2.10^7$ cm/sec and $L_g = 1$ μm we have $\tau_{FET} \approx 5$ psec.

However, to estimate a real delay time of our device one has to take into account RC limitations occurring mainly in its output circuit. As in the bipolar transistor we have a space-charge limited (output) current flowing across the insulator to the collector, which contributes to the collector delay time $\tau_c = (d_2 / V_{sat})$, where $d_2$ is the thickness of the insulator. Taking realistic values for $d_2 \approx 500$ Å and $V_{sat} \sim 10^7$ cm/sec we obtain $\tau_c \approx 0.5$ psec. The most essential RC limitation is expected to come from the source resistance $R_S$. In one embodiment (FIG. 1), the source is connected with the active device area through the relatively high resistive region of the quantum well which can cause a significant current restriction. A more satisfactory source contact design uses self-aligned technology for the source contact and the gate metal deposition. Contact metals (100 Å Ti) to provide a Schottky barrier to both the AlGaAs layers, and 200 Å Au:Ge alloy to make a lateral ohmic contact to the quantum well (M. Gurvitch, A. Kastalsky. S. Schwartz, D. M. Hwang, D. Butherus, S. Pearton and C. R. Gardner, J. Appl. Phys. Lett., 60, 3204, 1986) are deposited by electron beam evaporation allowing a source-to-gate metal discontinuity.

However, even with such an improvement of the source contact a further reduction of the lateral channel resistance $R_{ch}$ of the quantum well underneath the gate is still required, especially at highest achievable output currents $I_c(\phi \rightarrow 0)$ (for the device width $W \approx 100$ μm and the gate length $L_g 1$ μm $I_c$ will be in the range of 0.1 to 1A). The presence of $R_{ch}$ results in a lateral potential drop along the channel and thereby lowers the output current in the active device area remote from the source. The latter circumstance suggests that a decrease of the gate length is beneficial for the device speed, since reduction of the gate capacitance in this case may not be accompanied by lowering of the output current. To reduce the $R_{ch}$ it is therefore important to provide as high as possible initial ($V_G=0$) charge density in the quantum well, which can be done either by biasing the collector or by introducing an n+doping into the quantum well.

The latter approach (in spite of some sacrifice in mobility) seems preferable since it allows reduction and better control of the gate threshold voltage $V_T$. In addition, the top AlGaAs layer can be in this case also made insulating which will result in a lower gate leakage current and a larger gate voltage swing. For the sake of estimates, let us take reasonable values for the initial channel charge density $\sim 2.10^{12}$ cm$^{-2}$ and final maximum density $\sim 4 \times 10^{12}$ cm$^{-2}$. Having $L_g \approx 1$ $\mu$m we obtain $R_c \approx 0.24 (\Omega\text{mm})$ which for W=100 $\mu$m and $I_c=0.1$ A corresponds to a tolerable lateral voltage drop $\sim 0.24$ V. In this case the extrinsic transconductance defined as $g_m^{ex}=(g_m/1+g_m R_{ch})$ for $g_m \approx 10$ S/mm will be equal to $g_m^{ex} \approx 3$ S/mm. This results in the extrinsic delay time $C/g_m^{ex} \approx 0.6$ psec. Thus, even with RC limitations included our device can operate at $\sim 1$ psec delay time.

Figure 4:
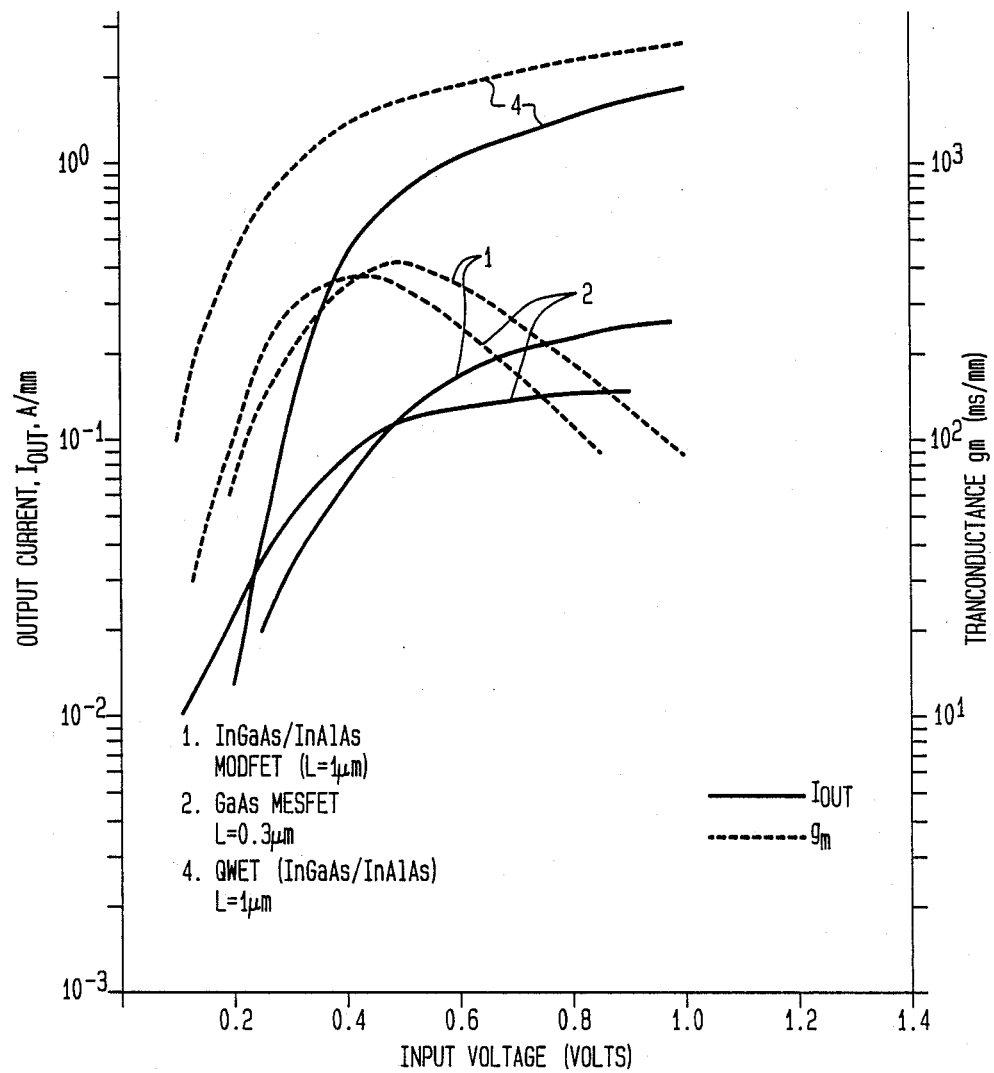
FIG. 4 is a graph showing the performance of different semiconductor devices as a function of input voltage, including the QWET according to the present invention.
Figure 5:
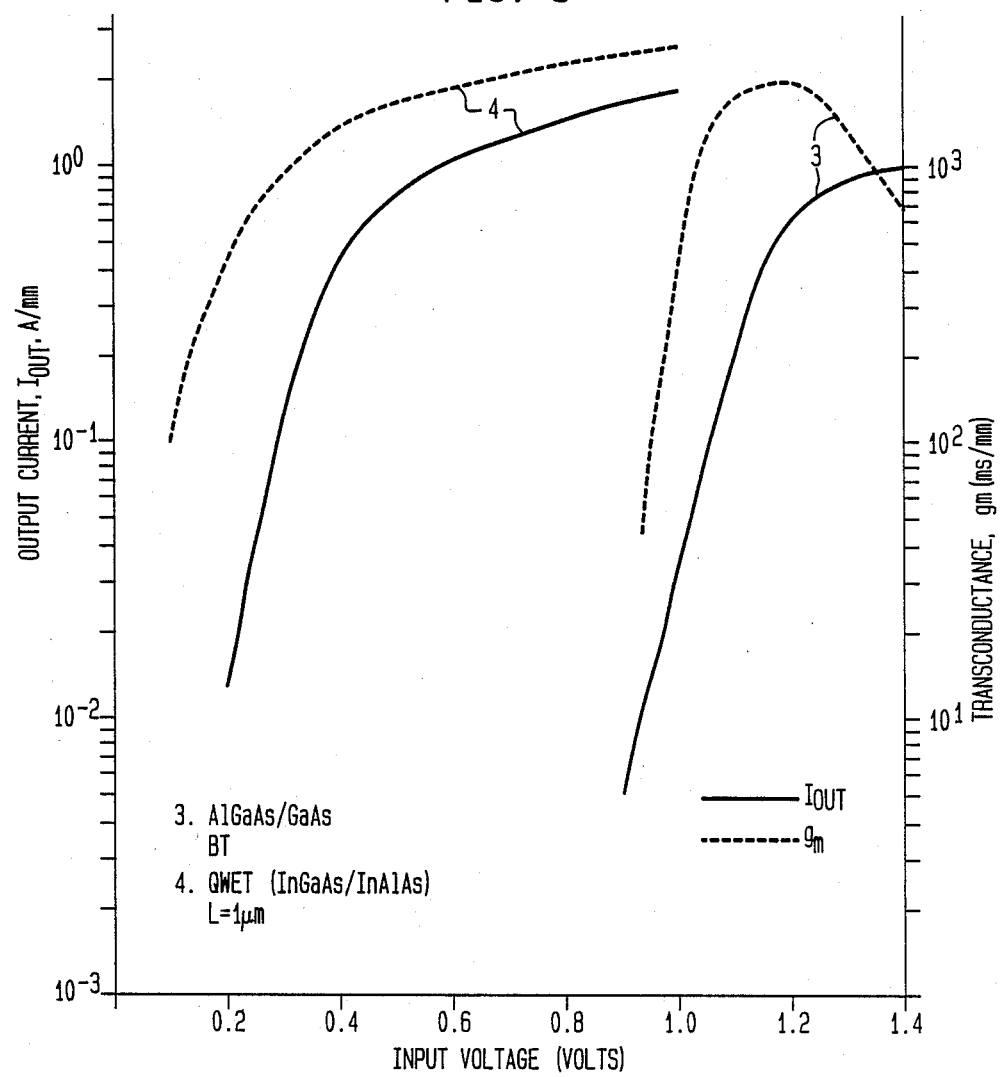
FIG. 5 is a graph showing the performance of a AlGaAs/GaAs bipolar transistor (BT) in comparison with the QWET according to the present invention.

FIG. 4 is a graph showing the performance of different semiconductor devices such as a MODFET and a MESFET as a function of input voltage, the comparison with and further showing the QWET made according to a present invention. FIG. 5 is a graph showing the performance of a AlGaAs/GaAs bipolar transistor (BT) in comparison with the QWET according to the present invention.

It is important to emphasize that the QWET combines the most attractive characteristics of both the FET and the bipolar transistor. As in the bipolar transistor, our device reveals an efficient current driving ability and a high speed of operation. Unlike the bipolar transistor, however, the QWET being a unipolar device does not suffer from a charge storage limiting the speed of the BT at high current levels. As in an FET, our device exhibits a high input impedance (FET insulating gate input characteristics), an extremely desirable property for logic applications.

In order to understand the relationship of device design to performance, a brief discussion of some key physical parameters of a semiconductor device is in order at this point. One of the key parameters is the delay time t, which is a measure of how fast a device is able to switch from one state (a "0" state) to another state (the "1" state). In general $$t=(c/g_m)$$

where c is the capacity measured in farads; $g_m$ is the transconductance, measured in 1/ohms; and t is the delay time in seconds.

The transconductance is the ratio of the change in output current to the change in input voltage. The transconductance $g_m$ is measured in units of inverse resistivity of milliSiemens per millimeter of device width (mS/mm), where the unit "Siemens" represents the reciprocal of an ohm. A distinction is made between measured transconductance $g_m$ and intrinsic transconductance $g_m$. The intrinsic transconductance is given by $$g_{mo}=(g_m/1-R_s g_m)$$

$R_s$ is the series source resistance, which may be computed from the gate voltage dependence of the drain current.

Since device performance, as measured by the delay time, is directly related to transconductance, a consideration of that parameter is important in comparing different devices. A comparison of bipolar, MESFET, and MISFET devices can be presented at this point.

The transconductance for a bipolar device is given by $$g_m=(dI_c/dV_e)$$

while the transconductance for a MESFET is given by $g_m=(dI_D/dV_G)$. An insulated gate field effect transistor (a MISFET or IGFET) operates by creating a conducting channel in the semiconductor region beneath the gate. The conducting channel is created by virtue of a control voltage applied to the gate. In an enhancement mode device, no conductive channel exists at zero gate voltage. As a gate voltage is applied and increased beyond a threshold voltage $v_T$, an inversion layer is formed. The channel has a sheet conductance given by $$g_c=\mu C_o(V_g-V_T)$$

where $C_o$ is the capacitance per unit area of the gate electrode, and $\mu$ is the majority carrier mobility in the induced channel. More particularly, $$C_o=E_X/T_x$$

where $E_x$ is the dielectric constant, and $T_x$ the thickness of the insulating layer underneath the gate.

One important relationship is the effect of scaling (change in device dimensions) on critical device parameters, such as transconductance. In a field effect transistor, as the gate length L decreases, the transconductance $g_m$ increases according to the following relationship:

$$g_m=(W/L)\mu C_o(V_G-V_T)$$

where W is the gate width.

Because of the principles of scaling, the dominant factor in determining the speed of a field effect transistor is its gate length. The smaller the minimum gate length, the shorter the distance the electrons need to travel, and the faster the basic technology will be. The minmum transistor gate length that may be implemented commercially is determined by more than simply the capability of the most advanced semiconductor manufacturing equipment. A thorough understanding of basic transistor physics is also critically important to optimize the device design. At very small dimensions, transistors may begin to function improperly because of the physical effects of very short dimensions. These physical barriers must be understood and taken into account at each level of manufacturing. For example, the recent introduction of 0.8-micron CMOS by a number of semiconductor companies has been limited by problems associated with transistor physics.

Figure 6:
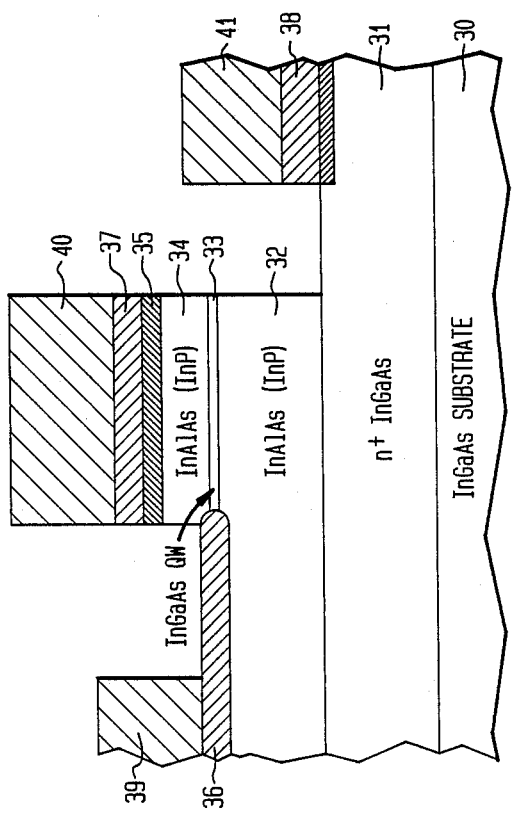
FIG. 6 is a simplified vertical sectional view, partially diagrammatic, of a second embodiment of a QWET in accordance with the present invention.

Another embodiment approach in fabrication of the QWET which provides improved gate characteristics is shown in FIG. 6 which represents an InGaAs-based QWET. Instead of Schottky barrier (known to be ineffective for those materials) a thin 100–200 Å layer of insulator such as silicon nitride (P. O'Conner, T. P.

Pearsall, K. Y. Cheng, A. Y. Cho, J. C. M. Hwang and K. Alavi, IEEE Electr. Dev. Lett., EDL-3, 64, 1982) or insulating InAlAs (K. Hirose, K. Ohata, T. Mizutani, T. Itoh and M. Ogawa, Intern. Sympos GaAs and Related Compounds, Karuizawa, 529, 1985) is deposited under the gate resulting in a reduction of the gate leakage and an increase of the gate voltage swing.

More particularly, FIG. 6 illustrates a second embodiment of the QWET semiconductor device implemented on an InGaAs substrate 30 including a first layer 31 of InGaAs semiconductor material of a first conductivity type (n+) and forming a first active region of the device which we may designate as the "collector". A second layer 32 of semiconductor material of a first conductivity type composed of a relatively wide energy bandgap material (such as InAlAs or InP) is disposed on the first layer 31 and forms a second active region of the device which we may designate as the "source". A third layer 33 of semiconductor material is provided disposed on the second layer 22 and composed of a relatively narrow energy bandgap material (such as InGaAs). The third layer 33 has an energy band step such that carriers are confined in that layer. As in the first embodiment, such a layer is a quantum well.

A fourth layer 34 of semiconductor material of a first conductivity type is further provided composed of a relatively wide bandgap material (such as InAlAs or InP) disposed on the third layer 33 and forming a third active region of the device which we may designate as the "gate". A thin layer 35 (100 to 200 Angstroms in thickness) of an insulating material, such as silicon nitride or insulating InAlAs, is disposed on the fourth layer 34 for the purposes noted above. A layer 37 of a metallic material is disposed over layer 35 to form the gate contact.

The device is provided with contacts 41 and 39 to the first and third layers respectively and a contact 40 to the gate. When appropriate electrical potential is provided to the contacts, and thus to the active regions, the resulting structure provides a new type of transistor action that has similarities and characteristics of both bipolar and field effect transistors in a single three terminal electronic device.

The contacts to the active regions are constructed by deposition of titanium (Ti) followed by a deposition of a germanium gold (Ge:Au) alloy to form composite layers 36, 37 and 38; and finally a top contact metal (such as gold) to form contacts 39, 40 and 41, respectively.

In conclusion, the present invention provides a novel transistor action based on the quantum properties of electrons confined in a quantum well. The gate modulation of charge density in the quantum well results in exponential variations of the output current of thermionic emission to the collector. The device combines the best features of both bipolar and field-effect transistors and provides a large current drive and a high speed.

While the invention has been illustrated and described as embodied in a quantum well emission semiconductor device, it is not intended to be limited to the details shown since various modifications and structural changes may be made without departing in any way from the spirit of the present invention. For example, the semiconductor materials are not limited to those shown, but may be selected from the group consisting of Group III-V, Group IV and Group II-VI semiconductors. Examples of possible combinations include InGaAs/InP, AlGaAsSb/GaSb, AlGaAsSb/AlSb, and AlInGaAs/AlInAs.

Without further analysis, the foregoing will so fully reveal the gist of the present invention that others can readily adapt it for various applications without omitting features that from the standpoint of prior art, fairly constitute essential characteristics of the generic or specific aspects of this invention, and, therefore, such adaptations should and are intended to be comprehended within the meaning and range of equivalence of the following claims.

What is claimed is:

1. A semiconductor device implemented on a substrate comprising:
   a first layer of semiconductor material of a first conductivity type disposed on said substrate and forming a first active region of said device,
   a second layer of semiconductor material of a first conductivity type composed of a relatively wide energy bandgap semiconductor material, disposed on said first layer and forming a second active region of the device;
   a third layer composed of a relatively narrow energy bandgap semiconductor material disposed on said second layer and defining a quantum well having an energy band step such that carriers are confined in that layer; and
   a fourth layer of semiconductor material of a first conductivity type composed of a relatively wide energy bandgap material disposed on said third layer and forming a third active region of the device,
   wherein said first layer of semiconductor material is composed of indium gallium arsenide, and further comprising a layer of an insulating material deposed on said fourth layer, and a layer of a metallic material disposed over said layer of insulating material.

2. A semiconductor device as defined in claim 1, wherein said second and said fourth layers are composed of InAlAs.

3. A semiconductor device as defined in claim 1, wherein said second and said fourth layers are composed of InP.

4. A semiconductor device as defined in claim 1, wherein said third layer is composed of InGaAs and has a thickness of less than 100 Angstroms.

5. A semiconductor device as defined in claim 1, wherein said insulating material is 100 to 200 Angstroms in thickness.

6. A semiconductor device as defined in claim 5 wherein said insulating material is composed of insulating InAlAs.

7. A semiconductor device implemented on a substrate comprising:
   a first layer of semiconductor material of a first conductivity type disposed on said substrate and forming a first active region of said device;
   a second layer of semiconductor material of a first conductivity type composed of a relatively wide energy bandgap semiconductor material, disposed on said first layer and forming a second active region of the device;
   a third layer composed of a relatively narrow energy bandgap semiconductor material disposed on said second layer and defining a quantum well having an energy band step such that carriers are confined in that layer; and
   a fourth layer of semiconductor material of a first conductivity type composed of a relatively wide energy bandgap material disposed on said third layer and forming a third active region of the device, and further comprising a first layer of metallic material disposed on said second layer of semiconductor material and making electrical contact with said second layer of semiconductor material for forming a first terminal of said device.

8. A semiconductor device as defined in claim 7, wherein said first layer of semiconductor material is composed of gallium arsenide.

9. A semiconductor device as defined in claim 7, where said second layer is composed of $Al_xGa_{1-x}As$, where x is a positive number less than 1.

10. A semiconductor device as defined in claim 7, where said third layer is composed of GaAs.

11. A semiconductor device as defined in claim 7, wherein said second layer is composed of $Al_xGa_{1-x}As$, where x is a positive number less than 0.4.

12. A semiconductor device as defined in claim 11, where said fourth layer is composed of $Al_{0.5}Ga_{0.5}As$.

13. A semiconductor device as defined in claim 7, wherein said third layer has a thickness of less than 100 Angstroms.

14. A semiconductor device as defined in claim 7, further comprising a second layer of metallic material disposed on said first layer of semiconductor material and making electrical contact with said first layer of semiconductor material for forming a second terminal of said device.

15. A semiconductor device as defined in claim 7, further comprising a third layer of metallic material disposed on said fourth layer of semiconductor material and making electrical contact with said fourth layer of semiconductor material for forming a third terminal of said device.

16. A semiconductor device as defined in claim 7, where said first layer of metallic material is a composite composed of a first layer of titanium, a second layer of gold/germanium making contact with said third layer of semiconductor material, and a third layer of gold.

17. A semiconductor device as defined in claim 14, where said second layer of metallic material is a composite composed of a first layer of titanium, a second layer of gold/germanium, and a third layer of gold.

18. A semiconductor device as defined in claim 15, where said third layer of metallic material is a composite composed of a first layer of titanium, a second layer of gold/germanium, and a third layer of gold.

19. A device as defined in claim 7, wherein said first layer forms a collector region during operation of said device.

20. A device as defined in claim 7, wherein said second layer forms a source region during operation of said device.

21. A device as defined in claim 7, wherein said fourth layer forms a gate region during operation of said device.

* * * * *

UNITED STATES PATENT AND TRADEMARK OFFICE
CERTIFICATE OF CORRECTION

PATENT NO. : 4,839,702
DATED : June 13, 1989
INVENTOR(S) : Anatoly Grinberg, Alexander Kastalsky It is certified that error appears in the above-identified patent and that said Letters Patent is hereby corrected as shown below:

Column 5, line 25, change "X" to --=--.
Column 5, line 55, change "outer" to --output--.
Column 5, line 66, change "when" to --with--.
Column 5, line 68, change "X" to --$\approx$--.
Column 6, line 2, change "$V_{th}$" to --$V_t$--.
Column 6, line 41, change "$\left(\dfrac{d_2}{V_{sat}}\right)$" to --$\dfrac{d_2}{V_{sat}}$--.
Column 6, line 65, change "Lg1um" to --Lg$\approx$1$\mu$m--.
Column 7, line 19, change "$\Omega_{mm}$" to --$\dfrac{\Omega}{mm}$--.

Column 8, line 15, change "$\left(\dfrac{dI_D}{dV_G}\right)$" to --$\dfrac{dI_D}{dV_G}$--.

Column 8, line 50, change "minmum" to --minimum--.
Column 9, line 67, change "InGaAs/InP" to --InGaAsP/InP--.

Signed and Sealed this

Twentieth Day of April, 1993

*Attest:*

MICHAEL K. KIRK

*Attesting Officer*     *Acting Commissioner of Patents and Trademarks*